(12) United States Patent
Imamura et al.

(10) Patent No.: US 10,600,647 B2
(45) Date of Patent: Mar. 24, 2020

(54) COATING APPARATUS

(71) Applicant: SCREEN Holdings Co., Ltd., Kyoto (JP)

(72) Inventors: Masanori Imamura, Kyoto (JP); Kazuo Morioka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/134,320

(22) Filed: Sep. 18, 2018

(65) Prior Publication Data
US 2019/0019666 A1    Jan. 17, 2019

Related U.S. Application Data

(62) Division of application No. 15/509,341, filed as application No. PCT/JP2015/060667 on Apr. 3, 2015, now abandoned.

(30) Foreign Application Priority Data

Sep. 22, 2014    (JP) ................................ 2014-192801

(51) Int. Cl.
*H01L 21/027*        (2006.01)
*B05C 11/10*         (2006.01)
(Continued)

(52) U.S. Cl.
CPC .......... *H01L 21/027* (2013.01); *B05B 12/088* (2013.01); *B05B 15/40* (2018.02);
(Continued)

(58) Field of Classification Search
None
See application file for complete search history.

(56) References Cited

U.S. PATENT DOCUMENTS 5,134,962 A * 8/1992 Amada ............... H01L 21/6715
                                                                118/688
2002/0029740 A1    3/2002 McLoughlin
(Continued)

FOREIGN PATENT DOCUMENTS

JP    H03-021309 A    1/1991
JP    H05-251389 A    9/1993
(Continued)

OTHER PUBLICATIONS

Office Action dated Jul. 30, 2018 in corresponding Taiwan Patent Application No. 104122061.
(Continued)

*Primary Examiner* — Nathan T Leong
(74) *Attorney, Agent, or Firm* — Ostrolenk Faber LLP (57) ABSTRACT

A coating apparatus includes an open/close valve having a motor that allows control of opening operation and closing operation in accordance with electric signals applied from a controller. The coating apparatus further includes a suck back valve having a motor that allows control of a volume variation in a flow path for suck back that is in communication with an upstream side and a downstream side of a pipe in accordance with electric signals from the controller. The controller allows control of start of the closing operation of the open/close valve and start of suction operation of the suck back valve through application of the electric signals to the respective motors. This achieves simple adjustment of liquid cut-off.

4 Claims, 9 Drawing Sheets

(51) Int. Cl.
    *H01L 21/67*     (2006.01)
    *B05B 12/08*     (2006.01)
    *B05B 15/40*     (2018.01)
    *B05C 11/08*     (2006.01)
    *B05C 11/02*     (2006.01)
    *A61J 3/00*     (2006.01)
    *B05B 13/02*     (2006.01)

(52) U.S. Cl.
    CPC ............ *B05C 11/023* (2013.01); *B05C 11/08* (2013.01); *B05C 11/10* (2013.01); *B05C 11/1002* (2013.01); *H01L 21/6715* (2013.01); *A61J 3/005* (2013.01); *B05B 13/02* (2013.01)

(56) References Cited

U.S. PATENT DOCUMENTS

| | | | |
|---|---|---|---|
| 2003/0047136 A1* | 3/2003 | Yang | B05C 11/1002 118/684 |
| 2003/0111178 A1 | 6/2003 | Morita | |
| 2007/0266936 A1 | 11/2007 | Shiobara et al. | 118/53 |
| 2008/0041465 A1 | 2/2008 | Kimura | |
| 2008/0087615 A1* | 4/2008 | Taniguchi | G03F 7/162 210/805 |
| 2013/0112628 A1 | 5/2013 | Yoshihara et al. | 210/767 |
| 2015/0375273 A1 | 12/2015 | Ishii et al. | |

FOREIGN PATENT DOCUMENTS

| | | |
|---|---|---|
| JP | 10-247614 A | 9/1998 |
| JP | 10-281069 A | 10/1998 |
| JP | H11-114476 A | 4/1999 |
| JP | H11-128817 A | 5/1999 |
| JP | 2000-202344 A | 7/2000 |
| JP | 2000-223403 A | 8/2000 |
| JP | 2001-252604 A | 9/2001 |
| JP | 2002-066487 A | 3/2002 |
| JP | 2003-136015 A | 5/2003 |
| JP | 2003136015 * | 5/2003 |
| JP | 2003-163162 A | 6/2003 |
| JP | 2003-185053 A | 7/2003 |
| JP | 2005-261996 A | 9/2005 |
| JP | 2006-167532 A | 6/2006 |
| JP | 2007-117892 A | 5/2007 |
| JP | 2007-311408 A | 11/2007 |
| JP | 2010-171295 A | 8/2010 |
| JP | 2013-098479 A | 5/2013 |
| JP | 2013-188663 A | 9/2013 |
| JP | 2014-057937 A | 4/2014 |
| JP | 2014-082513 A | 5/2014 |
| TW | 201434544 A | 9/2014 |

OTHER PUBLICATIONS

Notice of Allowance dated Sep. 25, 2018 in corresponding Japanese Patent Application No. 2014-192801.
International Search Report dated Jun. 16, 2015 in corresponding PCT International Application No. PCT/JP2015/060667.
Written Opinion dated Jun. 16, 2015 in corresponding PCT International Application No. PCT/JP2015/060667.
Office Action dated Mar. 13, 2018 for corresponding Japanese Patent Application No. 2014-192801.

* cited by examiner

| CONDITION | OPEN/CLOSE VALVE | | | SUCK BACK VALVE | | | | |
|---|---|---|---|---|---|---|---|---|
| | OPERATING AMOUNT (pulse) | OPENING TIME (s) | CLOSING TIME (s) | OPERATING AMOUNT (pulse) | SUCTION DELAY TIME (s) | PUSH DELAY TIME (s) | SUCTION TIME (s) | PUSH TIME (s) |
| WITH NO SECONDARY FILTER | 450 | 0.300 | 0.300 | 40 | 1.000 | 0.300 | 1.000 | 0.300 |
| WITH SECONDARY FILTER OF 3.0μM | 450 | 0.300 | 0.280 | 40 | 1.000 | 0.300 | 1.000 | 0.300 |
| WITH SECONDARY FILTER OF 1.0μM | 450 | 0.300 | 0.150 | 100 | 0.000 | 0.300 | 1.000 | 0.300 |

Fig. 9

COATING APPARATUS

CROSS REFERENCE TO RELATED APPLICATIONS

The present application is a divisional under 37 C.F.R. § 1.53(b) of prior U.S. application Ser. No. 15/509,341, filed Mar. 7, 2017, which is a 35 U.S.C. §§ 371 national phase conversion of PCT/JP2015/060667, filed Apr. 3, 2015, which claims priority of Japanese Patent Application No. 2014-192801, filed Sep. 22, 2014, the contents of which are incorporated by reference herein. The PCT International Application was published in the Japanese language.

TECHNICAL FIELD

The present invention relate to a coating apparatus that forms a thin film, such as a photoresist, on surface of a substrate, such as a semiconductor substrate, a glass substrate for liquid crystal display apparatus, a glass substrate for a photomask, and an optical disk substrate.

BACKGROUND ART

A currently-used coating apparatus includes a nozzle dispensing chemical such as a resist liquid to a substrate, a resist pipe in communication with the nozzle, and a pump that sucks up the chemical from a chemical container that stores a coating liquid and feeds out the chemical through the resist pipe. In addition, the resist pipe includes an open/close valve between the nozzle and the pump for opening/closing the resist pipe to selectively dispense and stop dispensation of the chemical from the nozzle. Moreover, a foreign substance removable filter is provided between the open/close valve and the pump for removal of foreign substances. See, for example, Patent Literature 1. Furthermore, a suck back valve is optionally provided between the nozzle and the open/close valve. See, for example, Patent Literature 2.

Here, a long distance between the foreign substance removable filter and the nozzle may cause generation of additional foreign substances in the chemical after the foreign substance removable filter removes the foreign substances. Accordingly, the foreign substance removable filter is desired to be inserted adjacent to the nozzle as possible. Patent Literature 3 discloses a feature of a foreign substance removable filter between the nozzle and the open/close valve. However, the feature may cause a problem of dripping (or drop) that the chemical drips down from the nozzle. The dripping chemical leads to uneven coating and some defective products.

Specifically, the supplied chemical is under pressure in the foreign substance removable filter even when the open/close valve is closed while the nozzle dispenses the chemical. Accordingly the chemical is dispensed for a while in an open/close valve closed condition due to a residual pressure in the foreign substance removable filter. This causes the dripping. Then, Patent Literature 3 discloses a suck back valve used for avoiding the dripping.

Figure 8:
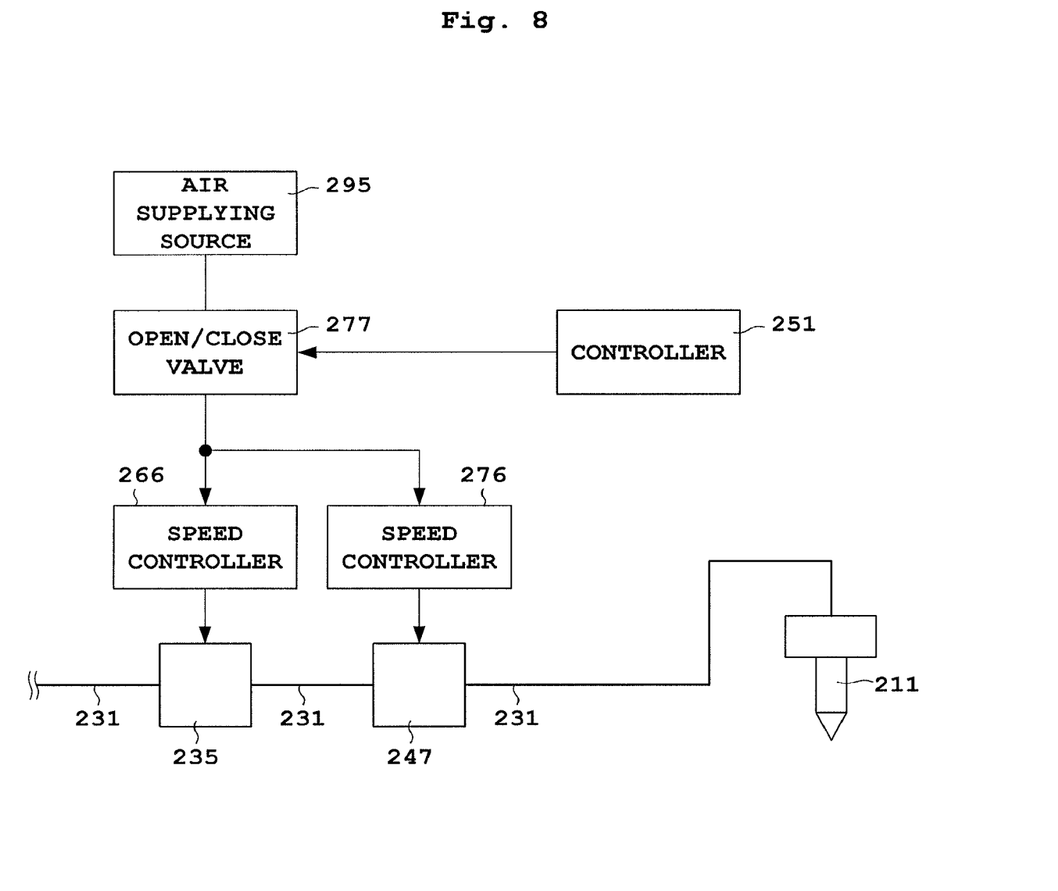
FIG. 8 illustrates a principal part of a currently-used coating apparatus.

Here, FIG. 8 illustrates principal parts of a currently-used coating apparatus. The coating apparatus of FIG. 8 includes an open/close valve 235 and a suck back valve 247 each driven through air supply. Here, the air supply is performed by adjusting a flow rate of air from an air supplying source 295 with speed controllers 266 and 276. The open/close valve 277 selectively supplies and stops the air supply. The open/close valve 277 is controlled with a controller 251.

PATENT LITERATURE

[Patent Literature 1] Japanese Patent Publication No. 2003-185053A (FIG. 5, for example)
[Patent Literature 2] Japanese Patent Publication No. 2007-117892A (FIG. 3, for example)
[Patent Literature 3] Japanese Patent Publication No. H11-128817A (FIGS. 4 and 5, for example)

SUMMARY OF INVENTION

Technical Problem

However, the following problem arises as in the above Patent Literature 3 when the foreign substance removable filter is provided on the pipe 231 between the nozzle 211 and the open/close valve 235 in the currently-used coating apparatus in FIG. 8. Specifically, speed controllers 266 and 276 each adjust a flow rate of air in a currently-used manner, thereby the open/close valve 235 controls an open/close speed and the suck back valve 247 controls an amount and a start timing of suck back. This causes control of "liquid cut-off" that actually stops chemical supply. Such liquid cut-off control is manually performed with the speed controllers 266 and 276. Typically, one coating apparatus includes many nozzles. The nozzles are each provided with a chemical supplying system through the above foreign substance removable filter. Accordingly, an excess operating time is needed for controlling the above "liquid cut-off" for each nozzle, and thus this reaches no practicable level. In addition, a plurality of coating apparatus that perform the same process is often provided in a substrate treating apparatus. Consequently, it was quite difficult to control the above "liquid cut-off" in a short time so as not to generate any machine difference among the coating apparatus. Then, it is desired to control the liquid cut-off in a short time even when the foreign substance removable filters are provided between the nozzles 211 and the open/close valve 235.

Figure 9:
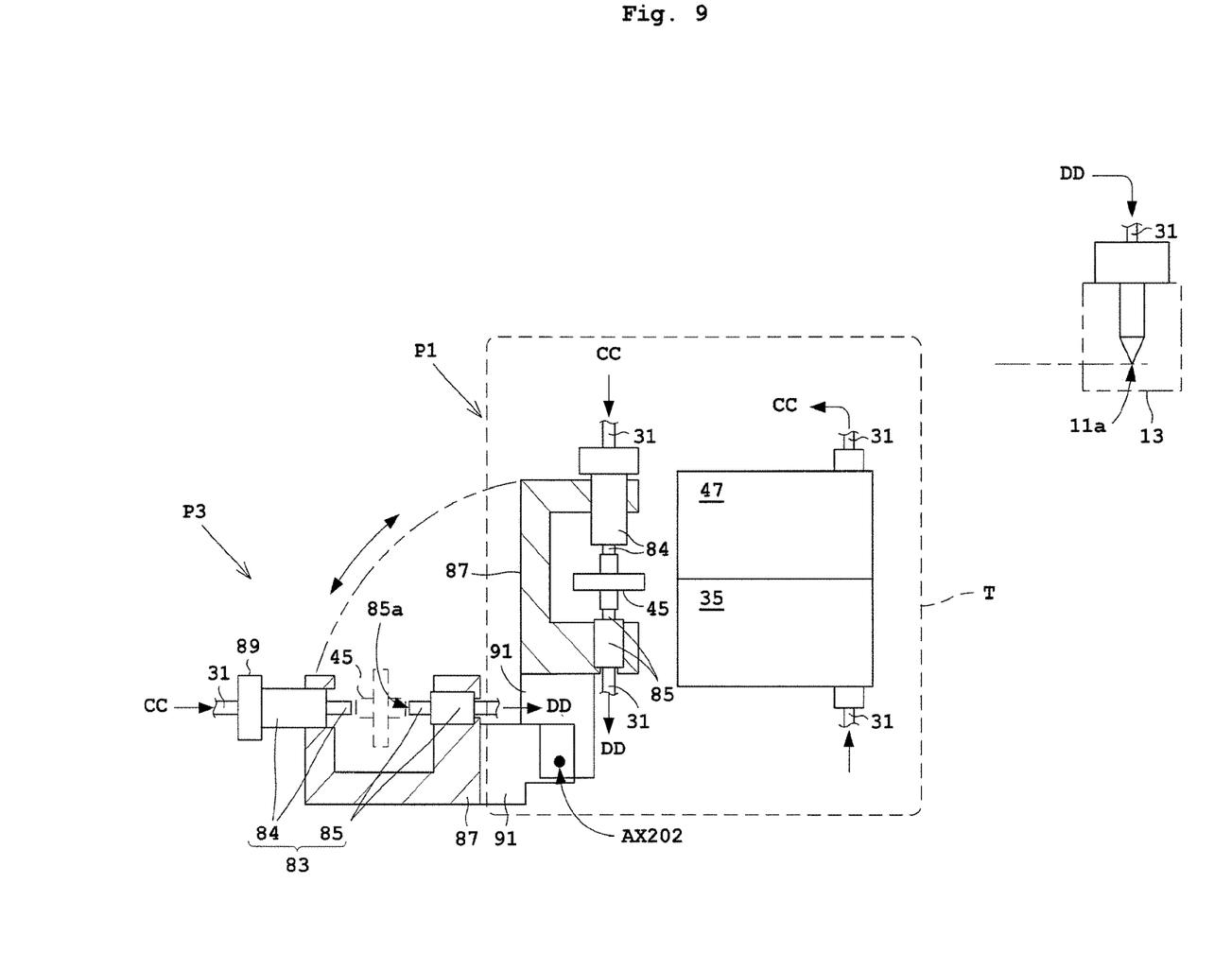
FIG. 9 illustrates a normal position and a filter replaceable position of the filter and the joint for explaining a problem to be solved.

Moreover, FIG. 9 illustrates a normal position P1 and a filter replaceable position P3 of a secondary filter 45 and a joint 83. FIG. 9 includes numerals same as in each embodiment, which is to be mentioned later.

The secondary filter (foreign substance removable filter) 45 is attachable/detachable to/from a pipe (resist pipe) 31. However, upon filter replacement, such another problem arises that chemical spills from the joint 83 (an upstream joint 84 and a downstream joint 85) connecting the secondary filter 45 and the pipe 31. That is, as illustrated in FIG. 9, it is assumed that the secondary filter 45 is provided on the joint 83 arranged in a vertical direction. See a normal position P1 in FIG. 9. Then, the joint 83 arranged in the vertical direction is tilted frontward (leftward in FIG. 9) around an axis AX202 below the filter 45. If the filter is replaced under such a tilted condition (see a filter replaceable position P3), the chemical spills from the joint 83. Consequently, it is desired to avoid spillage of the chemical from the joint 83 between the filter 45 and the pipe 31 upon the filter replacement.

The present invention has been made regarding the state of the art noted above, and its one object is to provide a coating apparatus that allows simple control of liquid cut-off even when a filter is disposed between the nozzle and the open/close valve. Moreover, another object is to provide a coating apparatus that avoids spillage of chemical from a joint between the filter and the pipe upon filter replacement.

Solution to Problem

The present invention is constituted as stated below to achieve the above object. One aspect of the present invention provides a coating apparatus. The coating apparatus includes a nozzle dispensing chemical to a substrate, a pipe in communication with the nozzle, a chemical supplying unit supplying the chemical through the pipe to the nozzle, an open/close valve on the pipe between the nozzle and the chemical supplying unit, and having an open/close drive unit that allows adjustment of opening operation and closing operation in accordance with electric signals, the open/close valve opening/closing the pipe, a nozzle-side filter on the pipe between the nozzle and the open/close valve, a suck back valve on the pipe between the nozzle-side filter and the open/close valve, and having a suction/push drive unit that allows adjustment of a volume variation in a flow path in communication with an upstream side and a downstream side of the pipe in accordance with electric signals, and a controller applying the electric signals to the open/close drive unit and the suction/push drive unit for controlling start of the closing operation of the open/close valve and start of suction operation of the suck back valve.

With the coating apparatus as the aspect of the present invention, the open/close valve includes the open/close drive unit that allows adjustment of the opening/closing operation in accordance with the electric signals from the controller. The suck back valve includes the suction/push drive unit that allows adjustment of the volume variation in the flow path in communication with the upstream and downstream sides of the pipe in accordance with the electric signals from the controller. The controller applies the electric signals to the open/close drive unit and the suction/push drive unit to control start of the closing operation of the open/close valve and start of the suction operation of the suck back valve. This achieves simple control of liquid cut-off.

Moreover, too much number of works has been needed for the currently-used manual operation when the liquid cut-off is performed to a plurality of types of chemical or a plurality of nozzles. On the other hand, the controller achieves simple adjustment of liquid cut-off. Accordingly, copy and re-use of parameters for a condition of the liquid cut-off is available, leading to adjustment of the liquid cut-off in a short time. Therefore, the apparatus with a practicable level is obtainable.

Moreover, it is preferred in the coating apparatus according to the aspect of the present invention includes the controller that performs control through application of the electric signals to the suction/push drive unit so as for the volume variation in the flow path of the suck back valve to be larger than that with no nozzle-side filter. For instance, a fine meshed filter is likely to undergo pressure of chemical inside the nozzle-side filter. On the other hand, since the volume variation, i.e., an amount of suck back is large, sufficiently suppressed pressure of chemical inside the nozzle-side filter is obtainable. This allows prevention of dripping from a front end of the nozzle while the liquid cut-off is rapidly performed.

Moreover, it is preferred in the coating apparatus according to the aspect of the present invention includes the controller that performs control through application of the electric signals to the suction/push drive unit so as to start the suction operation to increase a volume in the flow path of the suck back valve simultaneously with or before the start of the closing operation of the open/close valve. This achieves suppressed chemical pressure in the nozzle-side filter, and liquid cut-off from the nozzle while the chemical is pulled back toward downstream of the flow path (pulling back and cutting off of the chemical) simultaneously with or before the start of the closing operation of the open/close valve. Accordingly, liquid cut-off is performable sharply and smoothly.

Moreover, it is preferred in the coating apparatus according to the aspect of the present invention includes the controller that performs control through application of the electric signals to the suction/push drive unit so as to start the suction operation to increase a volume in the flow path of the suck back valve after the closing operation of the open/close valve is finished. For instance, when the nozzle-side filter with rough meshes is disposed, chemical is likely to pass through the nozzle-side filter. This causes difficulty in applying pressure to the nozzle-side filter. In such a case, the suck back valve performs the suction operation while the open/close valve is already closed. This obtains stable suction.

Moreover, it is preferred in the coating apparatus according to the aspect of the present invention further includes a joint and a joint moving mechanism. The joint joins the nozzle-side filter detachably to the pipe on the upstream side and the downstream side of the nozzle-side filter. The joint moving mechanism moves the joint such that an opening of the joint on the downstream side of the nozzle-side filter is higher in level than a front opening of the nozzle. Here, the opening of the joint on the downstream of the nozzle-side filter is higher in level than the front opening of the nozzle. Consequently, chemical in the pipe therebetween is discharged from the front opening of the nozzle without spilling from the joint on the downstream side of the nozzle-side filter. As a result, chemical contaminates no area around the joint or no operator's hand upon filter replacement, leading to enhanced filter replacement efficiency.

Advantageous Effects of Invention

With the coating apparatus as the aspect of the present invention, the open/close valve includes the open/close drive unit that allows adjustment of the opening/closing operation in accordance with the electric signals from the controller. The suck back valve includes the suction/push drive unit that allows adjustment of the volume variation in the flow path in communication with the upstream and downstream sides of the pipe in accordance with the electric signals from the controller. The controller applies the electric signals to the open/close drive unit and the suction/push drive unit to adjust start of the closing operation of the open/close valve and start suction operation of the suck back valve. This achieves simple control of liquid cut-off.

Embodiment 1

Figure 1:
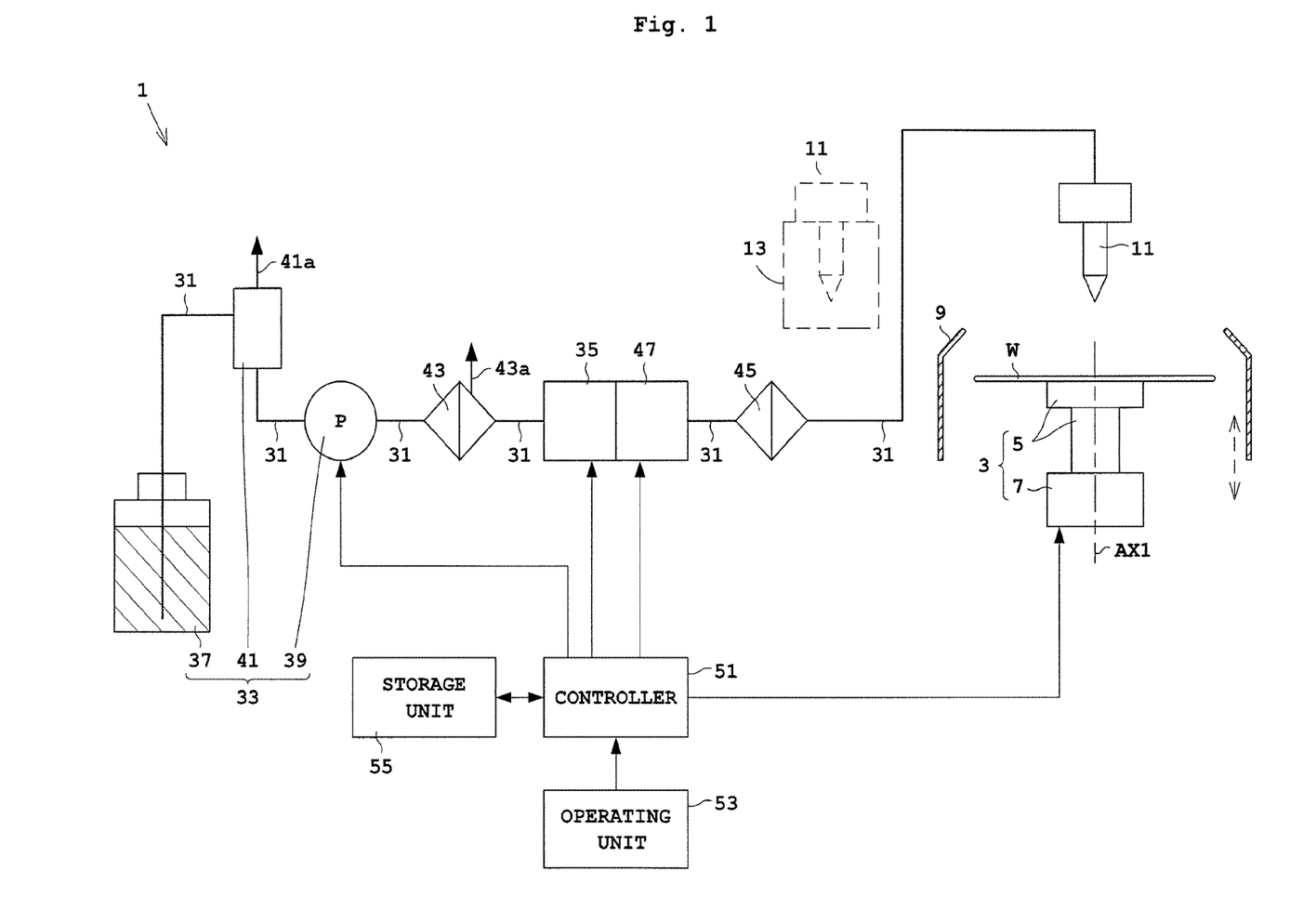
FIG. 1 schematically illustrates a coating apparatus according to Embodiment 1 of the present invention.
Figure 2:
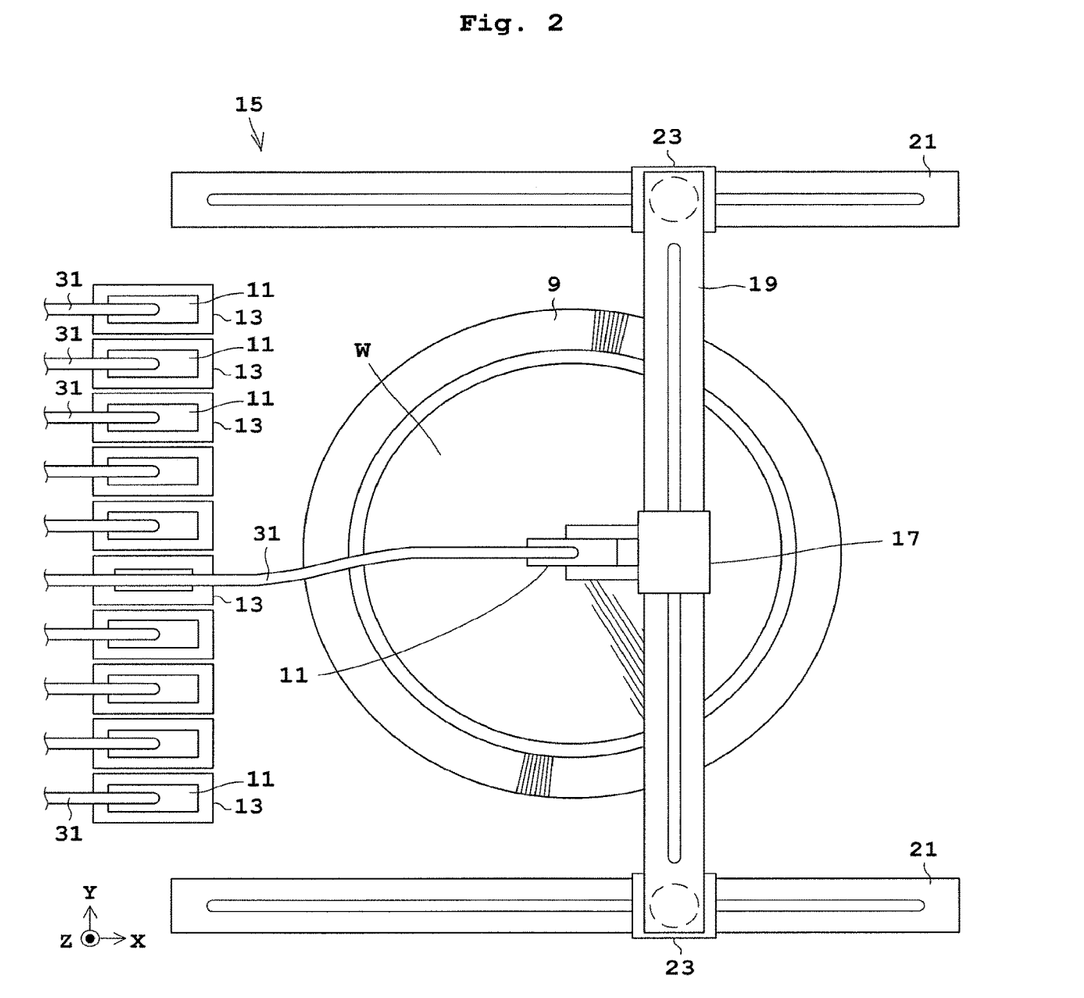
FIG. 2 illustrates a nozzle moving mechanism.
Figure 3:
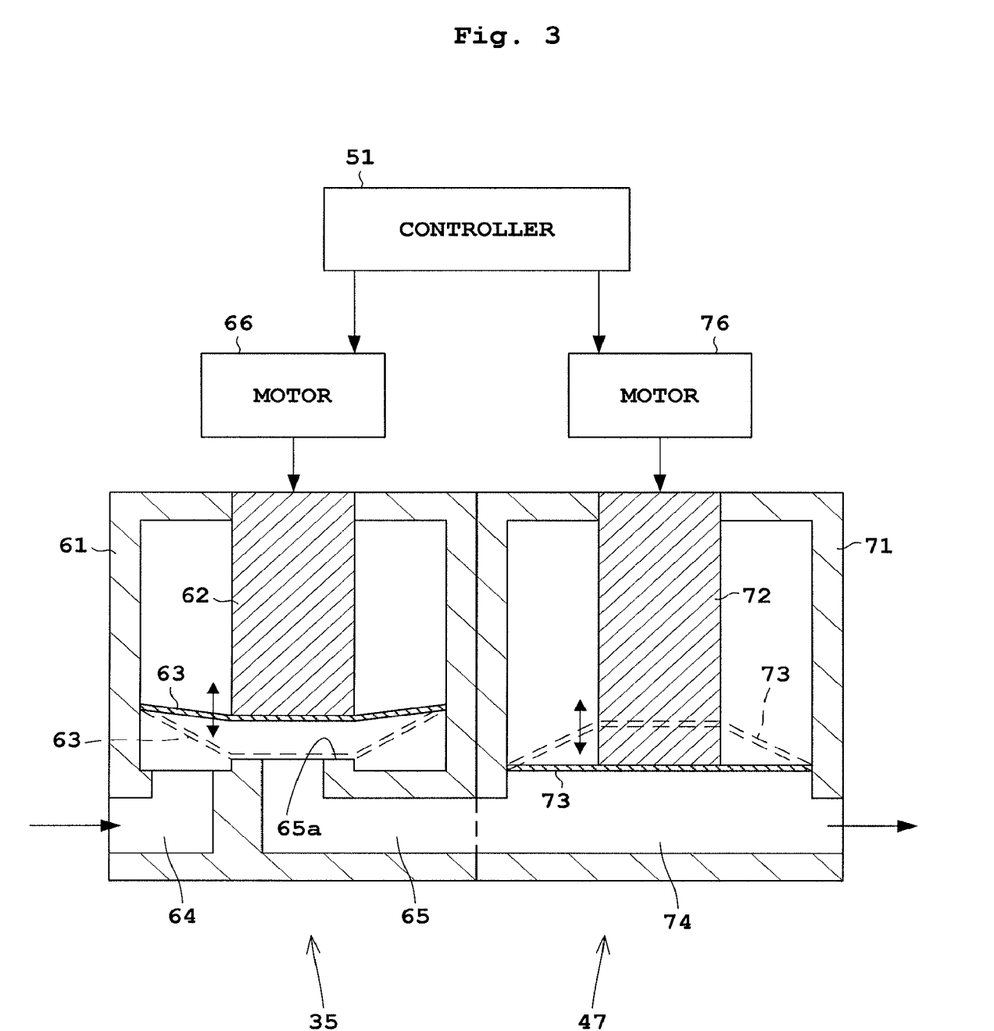
FIG. 3 illustrates an open/close valve and a suck back valve of Embodiment 1.

The following describes Embodiment 1 of the present invention with reference to drawings. FIG. 1 schematically illustrates a coating apparatus according to Embodiment 1. FIG. 2 illustrates a nozzle moving mechanism. FIG. 3 illustrates an open/close valve and a suck back valve of Embodiment 1.

Reference is made to FIG. 1. The coating apparatus 1 includes a spin holder 3. The spin holder 3 holds a substrate W horizontally, and spins the substrate W around an axis AX1 passing the substantial center of the substrate W. The spin holder 3 includes a spin chuck 5 that rotatably holds the substrate W, and a chuck rotating mechanism 7 that rotates the spin chuck 5. The spin chuck 5 has a vent path, not shown, formed therein. Air within the vent path is exhausted, whereby a back side of the substrate W is held in a vacuum-sucked manner. The chuck rotating mechanism 7 is formed by a motor and the like.

In addition, the coating apparatus 1 further includes a cup 9 that receives and collects chemical released out of the spinning substrate W while the chemical is dispensed. The cup 9 is moved upward/downward with a mechanism not shown. A nozzle 11 is disposed above the substrate W held with the spin holder 3. The nozzle 11 dispenses the chemical, such as a resist liquid, to the substrate W. The nozzle 11 is moved with a nozzle moving mechanism 15 (see FIG. 2) between a discharge position at the substantial center of the substrate W and a standby position of a standby part 13 outside the substrate W.

The coating apparatus 1 includes two or more nozzles 11 as illustrated in FIG. 2. Here, the number of the nozzles 11 may be one. The nozzles 11 may discharge different types of chemical individually. For instance, a color resist liquid and a resist liquid other than the color resist liquid, and a chemical for antireflection film formation is used as the chemical. The nozzles 11 are each in a standby condition in the standby part 13. The standby part 13 allows drain of the chemical dispensed from the nozzles 11.

The nozzle moving mechanism 15 includes a grasp part 17 that grasps one of the nozzles 11. The grasp part 17 moves the nozzle 11 two-dimensionally along a surface of the substrate W, and moves the nozzle 11 closer to and away from the substrate W. The following specifically describes one example of the nozzle moving mechanism 15. The grasp part 17 is moved with a first moving unit 19 in a Y-direction. The grasp part 17 and the first moving unit 19 are moved with a second moving unit 21 in an X-direction. That is, the first moving unit 19 and the second moving unit 21 allows movement of the grasp part 17 along the surface of the substrate W two-dimensionally (in the X- and Y-directions). In addition, the first moving unit 19 is attached to the second moving unit 21 via upper and lower cylinders 23. The upper and lower cylinders 23 cause the grasp part 17 and the first moving unit 19 to move in a Z-direction. Here, the first moving unit 19 and the second moving unit 21 are driven with a motor and the like. The upper and lower cylinders 23 are driven through supply of gas such as air.

Now return to FIG. 1. As noted above, the coating apparatus 1 includes the nozzle 11 that dispenses the chemical to the substrate W. The coating apparatus 1 further includes a pipe 31 in communication with the nozzle 11, a chemical supplying unit 33 that supplies the chemical to the nozzle 11 through the pipe 31, and an open/close valve 35 on the pipe 31 between the nozzle 11 and the chemical supplying unit 33.

The chemical supplying unit 33 includes a chemical container 37 that stores the chemical, a pump 39 that draws up and feeds the chemical in the chemical container 37, and a trap tank 41 on the pipe 31 between the chemical container 37 and the pump 39. The trap tank 41 detects a remaining quantity of chemical in the chemical container 37, and includes a remaining quantity sensor not shown. The trap tank 41 further includes a drain 41a. The drain 41a corresponds to a waste liquid line for exhausting air upon chemical supply after the remaining quantity of chemical is detected.

The coating apparatus 1 further includes a main filter 43 adjacent to the chemical supplying unit 33 on the pipe 31 between the chemical supplying unit 33 and the open/close valve 35, a second filter 45 on the pipe 31 between the nozzle 11 and the open/close valve 35, and a suck back valve 47 on the pipe 31 between the secondary filter 45 and the open/close valve 35. The suck back valve 47 varies a volume of flow path 74 for suck back (see FIG. 3) in communication with upstream and downstream sides of the pipe 31. This causes the suck back valve 47 to perform suction operation and pushing operation. Here, the chemical supplying unit 33, the main filter 43, the open/close valve 35, the suck back valve 47, and the secondary filter 45 are provided for a plurality of nozzles 11 individually.

The main filter 43 includes a drain 43a. Similar to the drain 41a, the drain 43a corresponds to a waste liquid line, and exhausts air mixed in connection with initial supply and other supply after replacement of the chemical container 37. When neither the drain 41a nor 43a is used, no chemical is supplied into the drain 41a or 43a with an open/close valve, not shown. Here, the secondary filter 45 corresponds to the nozzle-side filter in the present invention.

Figure 4:
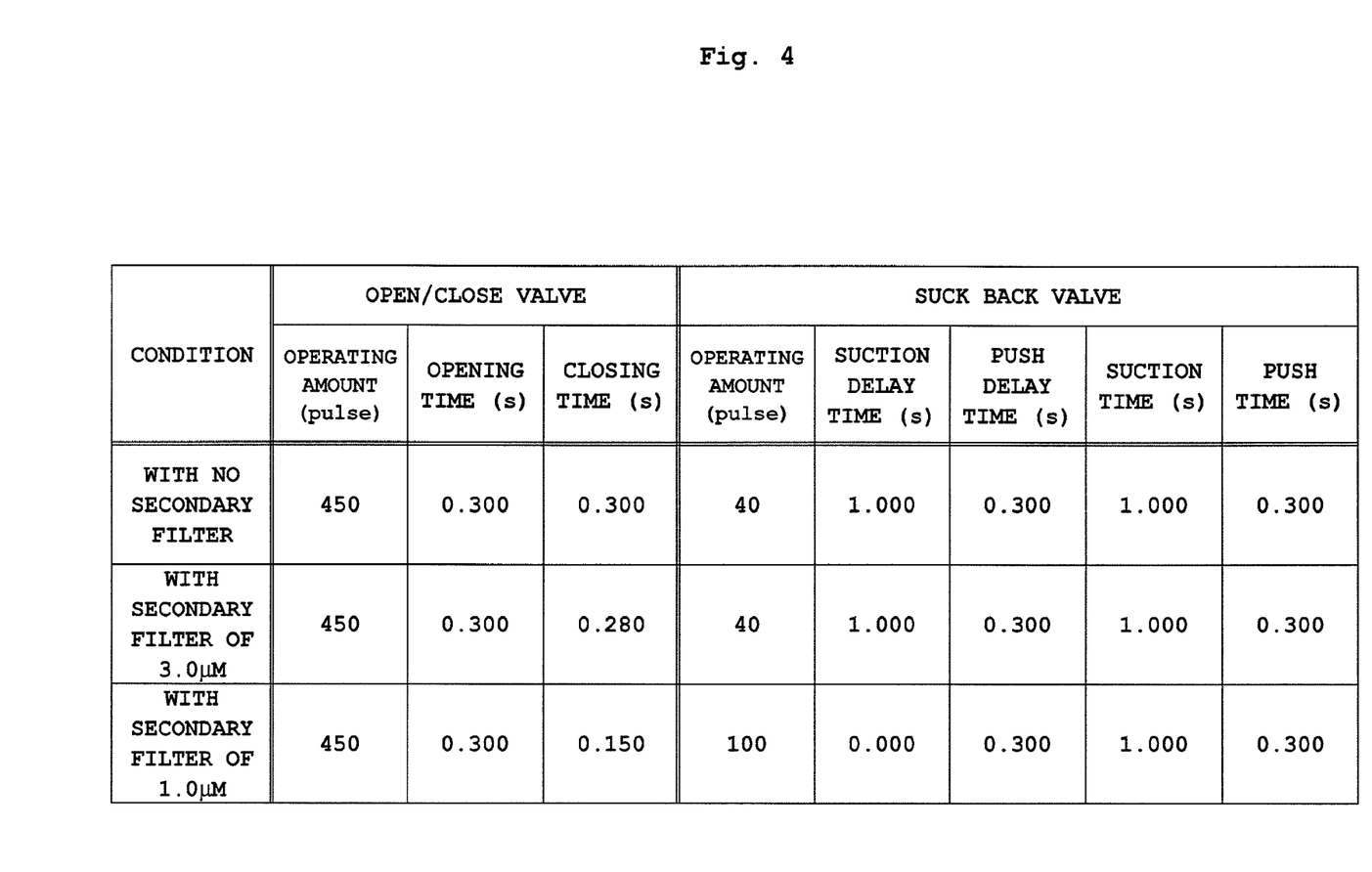
FIG. 4 exemplarily illustrates operating conditions of the open/close valve and the suck back valve.

The coating apparatus 1 further includes a controller 51 that controls every element of the apparatus 1 en bloc, an operating unit 53 that operates the coating apparatus 1, and a storage unit 55 that stores various operating conditions in FIG. 4. The controller 51 includes a CPU. For instance, the controller 51 controls the spin holder 3, the nozzle moving mechanism 15, the open/close valve 35, the pump 39, and the suck back valve 47. The operating unit 53 includes a display unit such as a liquid crystal monitor, and an input unit formed by at least any of a keyboard, a mouse, a switch and the like.

<Open/Close Valve and Suck Back Valve>

As illustrated in FIGS. 1 and 3, the open/close valve 35 and the suck back valve 47 are integrated, but they may be formed separately. The open/close valve 35 and the suck back valve 47 each include a DCV (digital control valve), for example, that allows control of various parameters with electric signals.

As in FIG. 3, the open/close valve 35 includes a hollow cylinder 61, a piston 62 within the cylinder 61 that moves upward/downward, and a diaphragm 63 on a front end of the piston 62. A periphery of the diaphragm 63 is fixed on an interior side wall of the cylinder 61. The diaphragm 63 divides an interior of the cylinder 61 in a moving direction of the piston 62. The diaphragm 63 is made of a fluorinated resin (e.g., PTFE). The cylinder 61 includes therein an upstream flow path 64 and a downstream flow path 65 that are in communication with each other. The downstream flow path 65 includes a valve seat 65a that receives the piston 62 via the diaphragm 63.

The open/close valve 35 includes a motor 66 that allows control of opening operation and closing operation in accordance with the electric signals. That is, the motor 66 drives movement of the piston 62 in the upward/downward directions. In addition, the motor 66 may include a speed reducer. When the motor 66 moves the piston 62 in the downward direction, the piston 62 allows contact to the valve seat 65a via the diaphragm 63. Accordingly, the downstream flow path 65 is closed. This causes the chemical to stop flowing from the upstream flow path 64 to the downstream flow path 65. On the other hand, when the motor 66 moves the piston 62 in the upward direction, the piston 62 is spaced away from the valve seat 65a together with the diaphragm 63. Consequently, the downstream flow path 65 is open. This causes the chemical to flow from the upstream flow path 64 to the downstream flow path 65.

The suck back valve 47 includes a hollow cylinder 71, a piston 72 within the cylinder 71 that moves upward/downward, and a diaphragm 73 attached to a front end of the piston 72. A periphery of the diaphragm 73 is fixed on an interior side wall of the cylinder 71. The diaphragm 73 divides an interior of the cylinder 71 in a moving direction of the piston 72. The diaphragm 73 is made of a fluorinated resin. The cylinder 71 includes therein a flow path 74 for suck back. In FIG. 3, the flow path 74 for suck back is in communication with the downstream flow path 65 of the open/close valve 35.

The suck back valve 47 includes a motor 76. The motor 76 allows control of a volume variation in the flow path 74 for suck back that is in communication with the upstream and downstream sides of the pipe 31 in accordance with the electric signals. That is, similar to the piston 62, the motor 76 drives movement of the piston 72 in the upward/downward directions. The motor 76 may include a speed reducer. When the motor 76 moves the piston 72 upward from a given level, suction operation is performed to increase the volume of flow path 74 for suck back. Moreover, the motor 76 returns the piston 72 from a lifted level to the given level, the volume of the flow path 74 for suck back becomes small (decreases). Accordingly, push operation is conducted.

In FIG. 3, the open/close valve 35 and the suck back valve 47 include the diaphragms 63 and 73, respectively. However, a configuration without the diaphragms 63 and 73 is available. Moreover, the open/close valve 35 and the suck back valve 47 may include a known configuration except that the valves are driven with the motors 66 and 76, respectively. The motor 66 corresponds to the open/close drive unit in the present invention. The motor 76 corresponds to the suction/push drive unit in the present invention.

The motors 66 and 76 are each controlled by a controller 51 based on operating conditions set in advance. Moreover, the motors 66 and 76 are controlled individually. Accordingly, both of the motors 66 and 76 may be made same in start operation, or either the motor 66 or the motor 76 may be set to start later. Moreover, at least either the moving amount or the speeds of the pistons 62 and 72 in the upward/downward directions is set variable by changing pulse signals applied to the motors 66 and 76, respectively. Moreover, in the open/close valve 35, speeds upon opening/closing operation are variable optionally. FIG. 4 illustrates operating conditions of the open/close valve 35 and the suck back valve 47. FIG. 4 is to be described with the following operation of the coating apparatus 1.

<Operation of Coating Apparatus>

The following describes operation of the coating apparatus 1. Reference is made to FIG. 1. The substrate W is transported to the spin holder 3 with a transport mechanism not shown. The spin holder 3 holds a back side of the substrate W, and spins the substrate W around an axis AX1 at a given spinning speed (rpm). Moreover, the nozzle moving mechanism 15 in FIG. 2 grasps any one of the nozzles 11 with a grasp part 17 in a standby position of the standby part 13, and moves the grasped nozzle 11 from the standby position to a discharge position at the spin center (axis AX1) of the substrate W.

Now return to FIG. 1. The pump 39 is in its operating state. The controller 51 controls the open/close valve 35 and the suck back valve 47. The controller 51 controls the open/close valve 35 to open the pipe 31, and controls the suck back valve 47 to perform push operation to decrease a volume of the flow path 74 for suck back. This causes the chemical fed by the pump 39 to feed through the pipe 31 from the pump 39 to the nozzle 11, a main filter 43, the open/close valve 35, the suck back valve 47, and the secondary filter 45, and to be dispensed from the nozzle 11. The secondary filter 45 allows removal of foreign substances produced downstream from the main filter 43. Consequently, in a color resist coating film generating step, for example, the secondary filter 45 executes 50% reduction of the foreign substances, leading to enhanced production yield from approximately between 70 and 80% to approximately 100%.

Moreover, the controller 51 controls the open/close valve 35 to close the pipe 31, and performs controls the suck back valve 47 to increase a volume of the flow path 74 for suck back, which corresponds to suction operation. This causes the chemical to stop discharge from the nozzle 11, leading to prevention of dripping of the chemical from the front end of the nozzle 11.

After a given quantity of the chemical is dispensed from the nozzle 11, the nozzle moving mechanism 15 moves the grasped nozzle 11 from the discharge position to the standby position, moves the nozzle 11 in the standby part 13, and spaces the nozzle 11 away from the grasp part 17. Moreover, the spin holder 3 stops spinning of the substrate W to release holding of the back side of the substrate W. The substrate W whose held back side with the spin holder 3 is released is transported to other processing devices with a transport mechanism not shown.

The following describes control of the open/close valve 35 and the suck back valve 47 with the controller 51. FIG. 4 illustrates operating conditions of the open/close valve 35 and the suck back valve 47. FIG. 4 illustrates three types of operating conditions, i.e., with no secondary filter, with a secondary filter of 3.0 μm, and with a secondary filter of 1.0 μm.

Firstly, FIG. 4 is to be described. The filter has fineness of 1.0 μm, and 3.0 μm. For instance, a filter of 3.0 μm passes through an object whose size is less than 3.0 μm, and captures an object whose size is equal to or larger than 3.0 μm. Here, an "operating amount" is indicated with a pulse signal (pulse) applied to the motors 66 and 76, respectively. Accordingly, the operating amount corresponds to a moving amount of the piston 62 of the open/close valve 35 and the piston 72 of the suck back valve 47, respectively. The operating amount also indicates a suck back amount of the suck back valve 47.

In addition, an "opening time" indicates time from when the open/close valve 35 starts the opening operation to when the open/close valve 35 finishes the opening operation, whereas a "closing time" indicates time from when the open/close valve 35 starts closing operation to when the open/close valve 35 finishes the closing operation. Moreover, a "suction delay time" indicates a delay time of suction operation relative to the start of the opening operation of the open/close valve 35, whereas a "push delay time" indicates a delay time of start pushing relative to the start of the opening operation of the open/close valve 35. Moreover, a "suction time" indicates time from when the suck back valve 47 starts suction operation to when the suck back valve 47 finishes the suction, whereas a "push time" indicates time from when the suck back valve 47 starts push to when the suck back valve 47 finishes the push. For instance, when the "operating amount" is "100 (pulse)" and the "suction time" is "1.000 (s)", such a state is indicated that a pulse of 100 is moved for 1.000 seconds.

The following describes operation in detail, for example, when the nozzle 11 stops discharge of the chemical.

[Secondary Filter of 1.0 μm]

The following describes operation of the secondary filter 45 whose fineness is 1.0 μm. When the nozzle 11 stops discharge of the chemical, the controller 51 firstly operates the open/close valve 35 as under. Specifically, the controller 51 controls the open/close valve 35 to perform closing operation more rapidly than opening operation through application of electric signals to the motor 66 of the open/close valve 35. In FIG. 4, an opening time of the secondary filter 45 of 1.0 μm is set "0.300 (s)", whereas a closing time of the secondary filter 45 of 1.0 μm is set "0.150 (s)". As noted above, the closing time of the open/close valve 35 is set short, leading to suppressed pressure of chemical within the secondary filter 45 from when the open/close valve 35 starts the closing operation to when the open/close valve 35 finishes the closing operation. Accordingly, rapid liquid cut-off is obtainable. In other words, suppressed dripping is obtainable. Moreover, suck back valve 47 allows effective performance of the suction operation.

Moreover, the controller 51 controls a volume variation (i.e., a suck back quantity) in the flow path of the suck back valve 47 to be larger than that when no secondary filter 45 is provided ("without secondary filter" in FIG. 4) through application of electric signals to the motor 76 of the suck back valve 47. In FIG. 4, an operating amount without the secondary filter 45 is set "40 (pulse)", whereas an operating amount of the secondary filter 45 of 1.0 μm is set double or more than that, i.e., "100 (pulse)". For instance, the secondary filter 45 of 1.0 μm is finer than that of 3.0 μm. In this case, pressure is likely to be applied within the secondary filter 45. On the other hand, a suck back quantity is larger than that without the secondary filter 45. Consequently, pressure within the secondary filter 45 is sufficiently suppressed. This allows prevention of dripping from the front end of the nozzle 11 under rapid liquid cut-off.

Here, operating amounts with the secondary filter 45 and without the secondary filter 45 are compared in accordance with operating amounts at the same liquid level of the chemical within the nozzle 11.

Moreover, the controller 51 controls the open/close valve 35 to perform the start of the closing operation simultaneously with the start of the suction operation by the suck back valve 47. That is, a suction delay time is set "0.000s". Moreover the suction delay time of negative values may be set. That is, the controller 51 may control the suction operation to increase the volume in the flow path of the suck back valve 47 before the open/close valve 35 starts the closing operation through application of electric signals to the motor 76. This allows suppressed pressure of chemical within the secondary filter 45 simultaneously with or before start of closing operation by the open/close valve 35, and allows liquid cut-off from the nozzle while drawing the chemical toward the downward of the flow path (pulling back and cutting off of the chemical). Consequently, sharp and smooth liquid cut-off is obtainable. However, too much rapid suction operation of the suck back valve 47 may produce no effect of the suction. For instance, the controller 51 may control the open/close valve 35 to finish closing operation before the suck back valve 47 finishes the suction operation.

[Secondary Filter of 3.0 μm]

The following describes operation of the secondary filter 45 whose fineness is of 3.0 μm. The controller 51 controls closing operation by the open/close valve 35 more rapidly than the opening operation through application of electric signals to the motor 66 of the open/close valve 35. In FIG. 4, an opening time of the secondary filter 45 of 3.0 μm is set "0.300 (s)", whereas a closing time of the secondary filter 45 of 3.0 μm is set "0.280 (s)". Even with the secondary filter 45, the chemical is likely to pass through the secondary filter 45 whose fineness is 3.0 μm rather than that whose fineness is 1.0 μm, and accordingly, it has difficulty in receiving pressure. However, a little more rapid closing operation by the open/close valve 35 achieves rapid liquid cut-off.

Moreover, as in FIG. 4, the controller 51 controls a volume variation in the flow path of the suck back valve 47 to be equal to that without the secondary filter 45 through application of electric signals to the motor 76 of the suck back valve 47. Without the secondary filter 45 and with the secondary filter 45 of 3.0 μm in FIG. 4, operating amounts of both of them are each set "40 (pulse)".

Moreover, the controller 51 performs control to start suction operation to increase a volume of the flow path of the suck back valve 47 after the open/close valve 35 finishes the closing operation through application of the electric signals to the motor 76 of the suck back valve 47. In FIG. 4, a suction delay time is set "1.000 (s)". After the open/close valve finishes the closing operation, no chemical flows. Suction by the suck back valve under such a condition provides stable suction. This is applicable to a rough filter.

With the aspect of the present embodiment, the open/close valve 35 includes the motor 66 that allows control of the opening operation and the closing operation in accordance with the electric signals. Moreover, the suck back valve 47 includes the motor 76. The motor 76 allows control of a volume variation in the flow path 74 for suck back that is in communication with the upstream and downstream sides of the pipe 31 in accordance with the electric signals. The controller 51 allows control of start of the closing operation of the open/close valve 35 and start of suction operation of the suck back valve 47 through application of the electric signals to the motors 66 and 76. This achieves simple adjustment of liquid cut-off.

Moreover, too much number of works has been needed for the currently-used manual operation when the liquid cut-off is performed for plural types of chemicals or to a plurality of nozzles. On the other hand, the controller allows simple adjustment of liquid cut-off. Accordingly, copy and re-use of parameters for a condition of the liquid cut-off is available, leading to adjustment of the liquid cut-off in a short time for the nozzles of the coating apparatus or a plurality of coating apparatus that perform the same processes. Therefore, the apparatus with a practicable level is obtainable.

Embodiment 2

The following describes Embodiment 2 of the present invention with reference to drawings. Here, the description common to that of Embodiment 1 is to be omitted.

In Embodiment 2, upon replacement of a secondary filter 45 provided via the pipe 31 between the nozzle 11 and the open/close valve 35, chemical is prevented from dripping from a joint 83 that connects the secondary filter 45 to the pipe 31.

Figure 5:
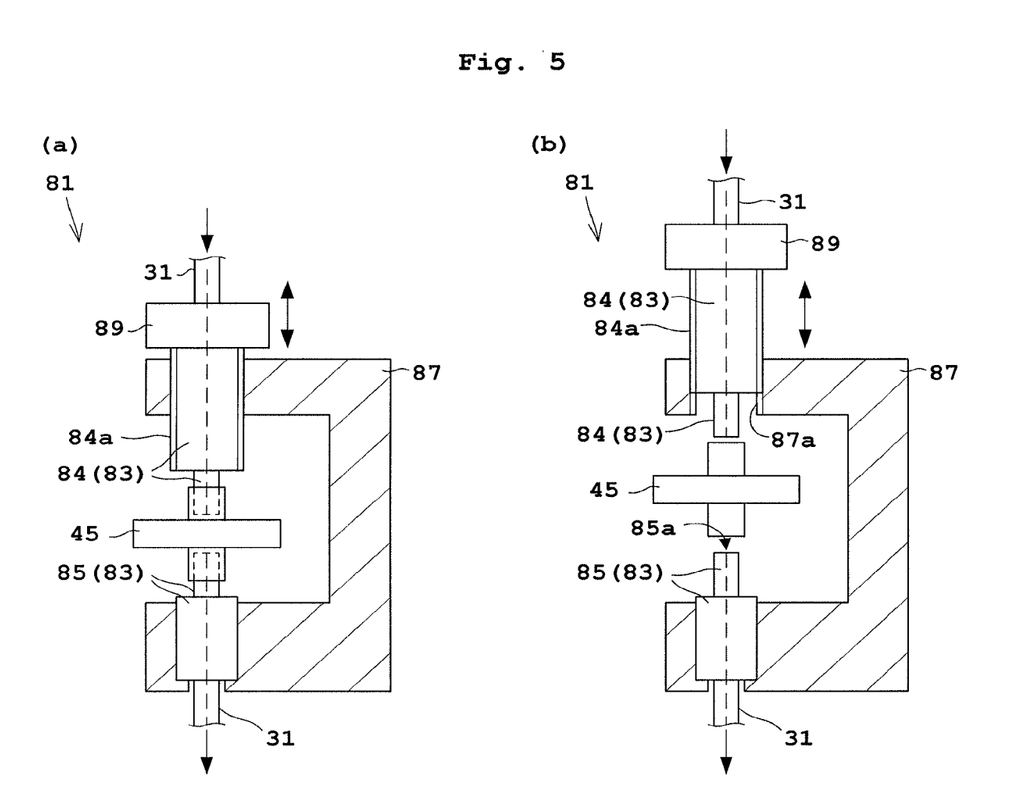
FIG. 5(a) illustrates filter attachment of a filter joint mechanism of Embodiment 2.
FIG. 5(b) illustrates filter replacement of the filter joint mechanism according to Embodiment 2.

FIG. 5(*a*) illustrates an attached secondary filter 45. FIG. 5(*b*) illustrates filter replacement. The coating apparatus 1 includes a filter joint mechanism 81 that attaches and detaches the secondary filter 45 into which the pipe 31 is inserted. That is, the filter joint mechanism 81 allows attachment and detachment of the secondary filter 45 to the pipe 31.

The filter joint mechanism 81 includes a joint 83 that detachably joints the secondary filter 45 to the pipe 31 on upstream and downstream sides of the secondary filter 45. The joint 83 includes an upstream joint 84 on the upstream side of the secondary filter 45 and a downstream joint 85 on the downstream side of the secondary filter 45.

The filter joint mechanism 81 further includes a joint holder 87 that holds the joint 83. The downstream joint 85 is fixed on the joint holder 87. On the other hand, the upstream joint 84 includes a thread 84*a* engaging a thread 87*a* (see FIG. 5(*b*)) of the joint holder 87 and a knob 89 fixed on the upstream joint 84. Rotation of the knob 89 causes the upstream joint 84 to move vertically on the plane of FIG. 5(*a*) relative to the joint holder 87, i.e., a direction in which the upstream joint 84 moves close to and away from the secondary filter 45. At this time, the rotation of knob 89 prevents the upstream pipe 31 from twisting.

With the filter joint mechanism 81 as noted above, the attachment state of the secondary filter 45 in FIG. 5(*a*) is changeable to a replacement (removable) state of the secondary filter 45 in FIG. 5(*b*) and vice versa. Here, the upstream joint 84 and the downstream joint 85 may each include the knob 89 and the thread to move close to or away from the secondary filter 45.

Figure 6:
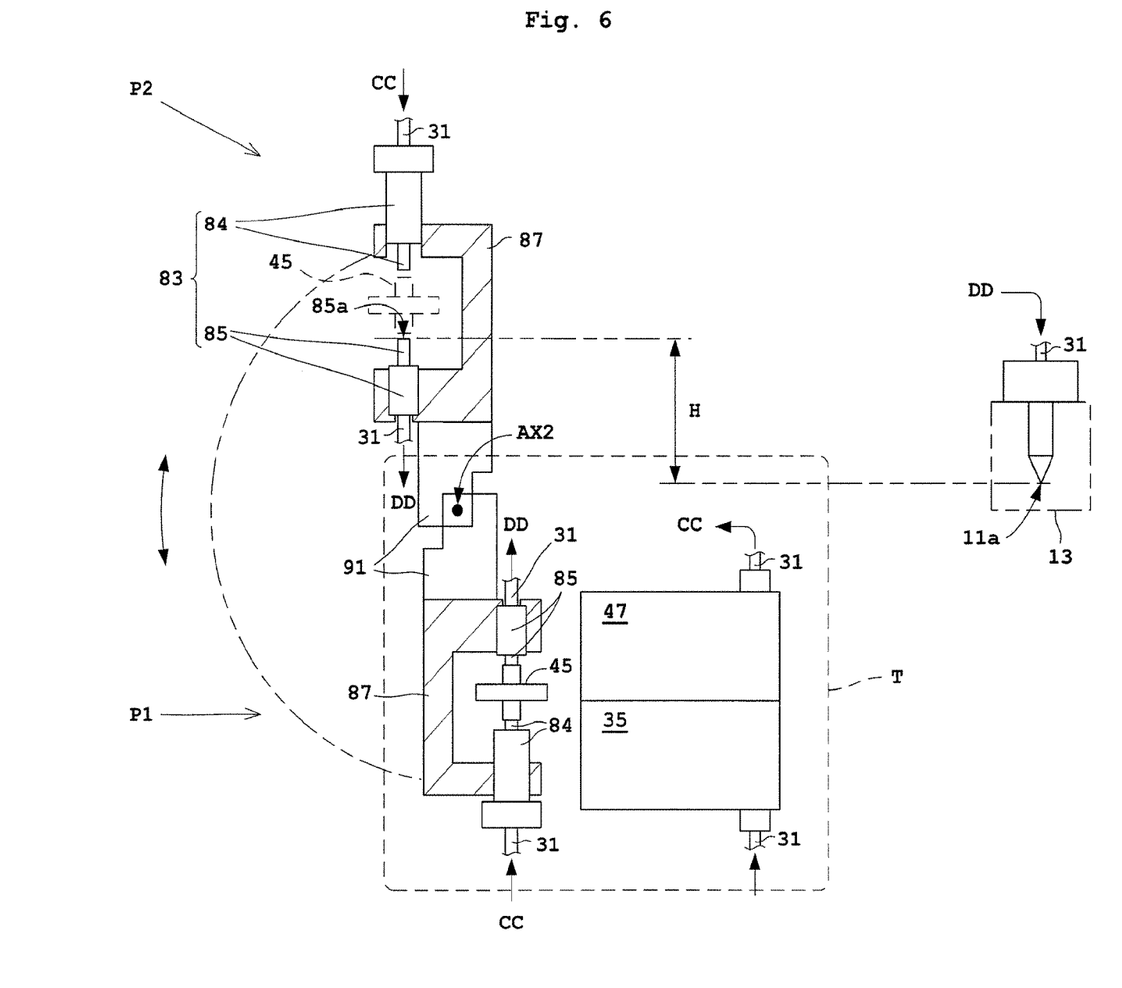
FIG. 6 illustrates a normal position and a filter replaceable position of a secondary filter and a joint.

Reference is next made to FIG. 6. FIG. 6 illustrates a normal position P1 and a filter replaceable position P2 of the secondary filter 45 and the joint 83. Upon normal operation such as apparatus operation, the secondary filter 45 and the joint 83 are at the position of the numeral P1, whereas the secondary filter 45 and the joint 83 are moved to the position of the numeral P2 upon filter replacement. The coating apparatus 1 includes an arm 91 that holds the joint 83 (joint holder 87) and the like. Here, the arm 91 corresponds to the joint moving mechanism in the present invention.

The arm 91 rotates around an axis AX2. The arm 91 rotates and moves the joint 83 to a position where an opening 85*a* of the downstream joint 85 of the secondary filter 45 is disposed higher in level than a front opening 11*a* of the nozzle 11 upon the filter replacement. That is, rotation and movement of the arm 91, i.e., the secondary filter 45 and the joint 83, causes the opening 85 of the downstream joint 85 connected to the nozzle 11 to be higher at a height H than the front opening 11 of the nozzle 11 in a standby state at the standby part 13. Here, an area T with dotted lines indicates an area where the secondary filter 45, the open/close valve 35, and the suck back valve 47 are disposed. Moreover, chemical from the suck back valve 47 is supplied to the secondary filter 45 (see an arrow CC in FIG. 6), whereas chemical from the secondary filter 45 is supplied to the nozzle 11 (see an arrow DD in FIG. 6).

The following describes replacement of the secondary filter 45. In FIG. 6, rotation of the arm 91 around the axis AX2 causes the secondary filter 45 and the joint 83 to move from the normal position P1 to the filter replaceable position P2. This moves the opening 85*a* of the downstream joint 85 of the secondary filter 45 to a position higher than the front opening 11*a* of the nozzle 11.

Moreover, when the secondary filter 45 and the joint 83 move to the filter replaceable position P2 in FIG. 6, the chemical, which has dripped from the joint 83 in FIG. 9, is discharged from the front opening 11*a* of the nozzle 11 without dripping from the joint 83. The nozzle 11 is disposed in the standby part 13 that allows exhaust for discharging the chemical. Accordingly, no problem occurs when the chemical is discharged from the front opening 11*a*.

Then, in FIG. 5(*a*), rotation of the knob 89 causes the upstream joint 84 to move away from the secondary filter 45. This movement leads to a state of FIG. 5(*b*). Under such a state, the secondary filter 45 is removed, and another new secondary filter 45 is attached to return the state to that of FIG. 5(*a*). Thereafter, rotation of the arm 91 around the axis AX2 in FIG. 6 causes the secondary filter 45 and the joint 83 to move from the filter replaceable position P2 to the normal position P1.

With Embodiment 2, the opening 85*a* of the downstream joint 85 on the downstream side of the secondary filter 45 is disposed at a higher position than the front opening 11*a* of the nozzle 11. Accordingly, the chemical within the pipe 31 between the downstream joint 85 and the nozzle 11 never drips from the opening 85*a* of the downstream joint 85, and thus the chemical is certainly discharged from the front opening 11*a* of the nozzle 11. Therefore, surroundings of the joint 83 or an operator's hand is never contaminated with the chemical upon filter replacement, achieving enhanced filter replacement efficiency.

The present invention is not limited to the foregoing examples, but may be modified as follows.

(1) In Embodiment 1 mentioned above, the open/close valve 35 and the suck back valve 47 are driven with the motors 66 and 76, respectively. However, such motors 66 and 76 are not limitative. For instance, the open/close valve 35 and the suck back valve 47 may be driven by electropneumatic regulators 93 and 94, respectively.

Figure 7:
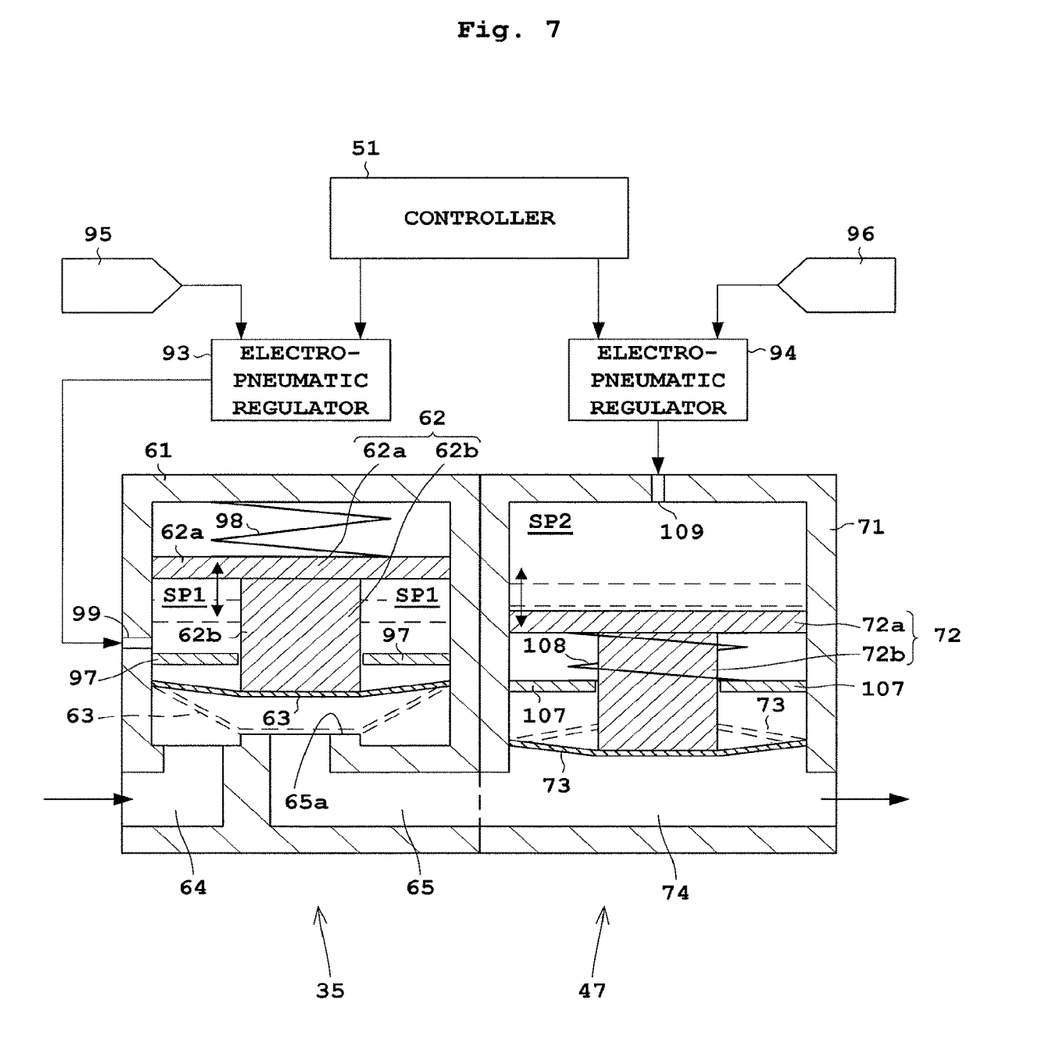
FIG. 7 illustrates an open/close valve and a suck back valve according to a modification of the present invention.

FIG. 7 illustrates an open/close valve 35 and a suck back valve 47 according to one modification of the present invention. Instead of motors 66 and 76 of the open/close valve 35 and the suck back valve 47 in FIG. 3, electropneumatic regulators 93 and 94 are provided. The electropneumatic regulators 93 and 94 each supply gas, such as air, with pressure set in accordance with electric signals from the controller 51 to the open/close valve 35 and the suck back valve 47. Here, gas supplying sources 95 and 96 supply gas, such as air, to the electropneumatic regulators 93 and 94, respectively.

The open/close valve 35 further includes a division wall 97 that is fixed on an interior side wall of the cylinder 61 and is slidable on a lower part 62*b* of the piston 62, a compression spring 98 between an interior upper wall of the cylinder 61 and an upper part 62*a* of the piston 62, and a suction/exhaust port 99 to which the electropneumatic regulator 93 supplies gas. Here, the upper part 62*a* of the piston 62 is slidable on the interior side wall of the cylinder 61.

When the electropneumatic regulator 93 supplies gas with pressure in accordance with electric signals to the suction/exhaust port 99, pressure in a space SP1 between the piston 62 and the division wall 97 increases. Then the piston 62 moves upward and away from the valve seat 65*a*, whereby chemical flows. On the other hand, when the electropneumatic regulator 93 decreases pressure within the space SP1, a restoring force of the compression spring 98 compressed due to upward movement of the piston 62 causes the piston 62 to move downward. Thereafter, when the piston 62 moves downward to contact the valve seat 65a, the chemical stops flowing.

As in FIG. 4, the controller 51 controls the open/close valve 35 to perform opening operation more rapidly than closing operation through application of the electric signals to the electropneumatic regulator 93. An opening time and a closing time of the open/close valve 35 are operated with the electropneumatic regulator 93 by controlling a time from a reference pressure (e.g., 0 MPa) of a closed state to given positive pressure of an open state or from the given positive pressure of an open state to the reference pressure of a closed state.

Moreover, as in FIG. 7, the suck back valve 47 further includes a division wall 107 that is fixed on an interior side wall of the cylinder 71 and is slidable on a lower part 72b of the piston 72, a compression spring 108 between an upper part 72a of the piston 71 and the division wall 107, and a suction/exhaust port 109 to which the electropneumatic regulator 94 supplies gas. Here, the upper part 72a of the piston 72 is slidable on the interior side wall of the cylinder 71.

When the electropneumatic regulator 94 supplies gas with pressure F1 in accordance with electric signals to the suction/exhaust port 109, pressure in a space SP2 between the interior upper wall of the cylinder 71 and the piston 72 increases, whereby the piston 72 moves downward. Then suction operation is performed with reference to the position to which the piston 72 moves downward. That is, the electropneumatic regulator 94 supplies gas with pressure F2 lower than the pressure F1 (F1>F2) to the suction/exhaust port 109. Accordingly, the pressure within the space SP2 decreases, whereby a restoring force of the compression spring 108 causes the piston 71 to move upward by a distance corresponding to the pressure F2. Such upward movement of the piston 71 achieves suction operation. Moreover, push operation is again performed as noted above with the electropneumatic regulator 94 to supply gas of the pressure F1 to the suction/exhaust port 109.

Moreover, as in FIG. 4, the controller 51 controls a volume variation in the flow path 74 for suck back of the suck back valve 47 to be larger than that with no secondary filter 45 through application of the electric signals to the electropneumatic regulator 94. In such a case, the pressure F1 and F2 upon discharge and stop discharge of the chemical, respectively, is controlled. In addition, timing control is also performed for starting the closing operation of the open/close valve 35 and starting suction operation of the suck back valve 47.

Moreover, the open/close valve 35 and the suck back valve 47 in FIG. 7 are one example of the present invention, and thus other known elements are available. In addition, in this modification, the open/close valve 35 includes the electropneumatic regulator 93, whereas the suck back valve 47 includes the electropneumatic regulator 94. In other words, the electropneumatic regulator 93 corresponds to the open/close drive unit in the present invention, and the electropneumatic regulator 94 corresponds to the suction push drive unit in the present invention.

(2) In Embodiment 2 mentioned above, the secondary filter 45 and the joint 83 move between the normal position P1 and the filter replaceable position P2 through rotation of the arm 91 around the axis AX2. However, this is not limitative. For instance, the secondary filter 45 and the joint 83 may move between the normal position P1 and the filter replaceable position P2 through linear movement of the secondary filter 45 and the joint 83 in a vertical direction along a rail. Here, a mechanism to move the secondary filter 45 and the joint 83 linearly in the vertical direction corresponds to the joint moving mechanism in the present invention.

(3) In the embodiments and modification mentioned above, the open/close valve 35 may be driven with the motor 66 of Embodiment 1, and the suck back valve 47 may be driven with the electropneumatic regulator 94 of the modification (1). Moreover, the open/close valve 35 may be driven with the electropneumatic regulator 93 of the modification (1), and the suck back valve 47 may be driven with the motor 76 of Embodiment 1. Moreover, combination of at least any of other known open/close drive unit and suction push drive unit is applicable.

REFERENCE SIGNS LIST

1 . . . coating apparatus
11 . . . nozzle
11a . . . front opening
31 . . . pipe
33 . . . chemical supplying unit
35 . . . open/close valve
43 . . . main filter
45 . . . secondary filter
47 . . . suck back valve
51 . . . controller
66, 76 . . . motor
74 . . . flow path for suck back
81 . . . filter joint mechanism
83 . . . joint
84 . . . upstream joint
85 . . . downstream joint
85a . . . opening
91 . . . arm
93, 94 . . . electropneumatic regulator
AX2 . . . axis
P1 . . . normal position upon apparatus operation
P2 . . . filter replaceable position
H . . . height

The invention claimed is:

1. A method of adjusting a coating apparatus comprising:
a nozzle dispensing chemical to a substrate;
a pipe in communication with the nozzle;
a chemical supplying unit supplying the chemical through the pipe to the nozzle;
an open/close valve on the pipe between the nozzle and the chemical supplying unit, and having an open/close drive unit that allows adjustment of opening operation and closing operation in accordance with first electric signals, the open/close valve opening/closing the pipe; and
a suck back valve on the pipe between the nozzle and the open/close valve, and having a suction/push drive unit that allows adjustment of a volume variation in a flow path in communication with an upstream side and a downstream side of the pipe in accordance with second electric signals;
the method comprising:
a selecting step of selecting any nozzle-side filter of a plurality of nozzle-side filters having different respective fineness for providing the nozzle-side filter on the pipe between the nozzle and the suck back valve;

a first changing step of changing an operating amount of the closing operation of the open/close valve in accordance with the fineness of the selected nozzle-side filter for applying the first electric signals to the open/close drive unit; and a second changing step of changing an operating amount of the suction operation of the suck back valve in accordance with the fineness of the selected nozzle-side filter for applying the second electric signals to the suction/push drive unit.

2. The method of adjusting the coating apparatus according to claim 1, wherein the first changing step further comprises the step of:

shortening a closing time of the open/close valve as the fineness of the selected nozzle-side filter decreases for applying the first electric signals to the open/close drive unit.

3. The method of adjusting the coating apparatus according to claim 1, wherein the second changing step further comprises the step of:

increasing an operating amount of the suck back valve as the fineness of the selected nozzle-side filter decreases for applying the second electric signals to the suction/push drive unit.

4. The method of adjusting the coating apparatus according to claim 1, wherein the second changing step further comprises the step of:

decreasing a suction delay time of the suck back valve as the fineness of the selected nozzle-side filter decreases for applying the second electric signals to the suction/push drive unit.

* * * * *